United States Patent
Salminen

(10) Patent No.: US 6,574,457 B1
(45) Date of Patent: Jun. 3, 2003

(54) TWO-TRANSISTOR MIXER

(75) Inventor: Vesa-Matti Salminen, Oulu (FI)

(73) Assignee: Nokia Mobile Phones Limited, Espoo (FI)

( * ) Notice: Subject to any disclaimer, the term of this patent is extended or adjusted under 35 U.S.C. 154(b) by 0 days.

(21) Appl. No.: 09/525,782

(22) Filed: Mar. 15, 2000

(51) Int. Cl.$^7$ ................................................. H04B 1/04
(52) U.S. Cl. ......................... 455/112; 455/333; 455/318
(58) Field of Search ................................. 455/323, 333, 455/326, 327, 324, 319, 318, 313, 112, 118; 331/117 R; 332/105, 103, 144, 146; 375/302; 307/529; 327/356

(56) References Cited

U.S. PATENT DOCUMENTS

| | | | |
|---|---|---|---|
| 4,461,042 A | * 7/1984 | Tanabe et al. | 455/333 |
| 4,658,440 A | * 4/1987 | Pavio et al. | 455/324 |
| 4,977,617 A | * 12/1990 | Sharma et al. | 455/319 |
| 5,006,811 A | * 4/1991 | Kruger | 329/354 |
| 5,039,891 A | 8/1991 | Wen et al. | 307/529 |
| 5,767,726 A | * 6/1998 | Wang | 327/356 |
| 5,789,963 A | * 8/1998 | Sakusabe | 327/356 |
| 5,844,449 A | 12/1998 | Abeno et al. | 332/105 |
| 5,983,089 A | * 11/1999 | Mohwinkel et al. | 455/323 |
| 6,064,872 A | * 5/2000 | Vice | 455/326 |

OTHER PUBLICATIONS

Terrovitis, Manolis T., et al., "Noise in Current–Commutating CMOS Mixers", IEEE, vol. 34, No. 6, Jun. 1999 (6 pages).

Karanicolas, Andrew N., "A 2.7–V 900–MHz CMOS LNA and Mixer", IEEE, vol. 34, No. 12, Dec. 1996.

* cited by examiner

*Primary Examiner*—Thanh Cong Le
*Assistant Examiner*—C. Chow
(74) *Attorney, Agent, or Firm*—Perman & Green, LLP

(57) ABSTRACT

A two transistor mixer for mixing radio frequency signals in a communications device. A mixer core section comprised of a pair of matched semiconductor devices having their drain ports connected to a first common node through matched load resistors and their source ports connected to a second common node end. A local oscillator (LO) signal input connected to the first and second nodes, wherein the connection to the second node is through a current source. A radio frequency (RF) signal input connected to the gate ports of said pair of semiconductor devices and an intermediate frequency (IF) output obtained from the drain ports of said pair of semiconductor devices.

5 Claims, 4 Drawing Sheets

TWO-TRANSISTOR MIXER

BACKGROUND OF THE INVENTION

1. Field of the Invention

The present invention relates to radio frequency mixers and, more particularly, to balanced mixers.

2. Prior Art

In the context of a communication device, such as a mobile phone, there is a need to combine the RF input signal with a local oscillator signal to generate an intermediate frequency signal for filtering. This function is performed in a mixer and it is this circuit component to which this application is directed.

A singly balanced mixer is shown in FIG. 3, and includes a differential pair of transistors connected to a collector of an RF-amplifier transistor. The local oscillator signal is connected to the bases of the differential switching pair and the RF input is connected to the base of the common emitter amplifier transistor. The RF-amplifier converts input RF-voltage to current at its collector. LO switching transistors alternate the routing of this current to either of the loads.

FIG. 4 shows a double balanced mixer, commonly known as a Gilbert cell mixer. A differential RF transistor pair converts differential RF input voltage to differential current. Two sets of LO switching transistor pairs are used to alternate the routing of the current at the output. The mixer operates as a sign-switcher. The double balanced mixer was designed, among other things, to eliminate the need, in the case of the singly balanced mixer, to cancel out. the local oscillator component from the IF signal. The proliferation of components over the singly balanced mixer, however, creates a sensitive matching challenge. For optimum performance, double balanced mixers require that the component pairs, be matched as close as possible in order to maximize port to port isolation and to reduce undesirable distortion. Conventional integrated double balanced mixer circuits may need compensation for any imbalance by either electrical means or even laser tuning.

It is a purpose of this invention to design a mixer having many of the attributes of the double balanced mixer, while minimizing matching problems. This is accomplished with a reduction in the number of components.

SUMMARY OF THE INVENTION

A mixer is provided for mixing radio frequency signals in a communications device. A single pair of matched transistors comprise the core of the mixer. Each of the transistors have their drain port connected to the in phase local oscillator signal(LO) through matching resistance loads and their source port connected to a reverse phase local oscillator signal(−LO) through a resistor acting as a current source. No DC bias is applied between such ports. The gate ports of each of the transistors in the pair receive the differential radio frequency signal. The intermediate frequency output is obtained from the drain ports of the matched transistors. In the positive half cycle of the local oscillator signal the mixer will operate as a differential pair having inverting power gain, while in the negative half cycle of the local oscillator signal, the mixer circuit will operate as two source followers, i.e. two non-inverting amplifiers having current gain. In this manner a mixer is provided with port to port isolation, low noise, and high linearity. This is accomplished with only two sets of matched components.

BRIEF DESCRIPTION OF THE DRAWINGS

The foregoing aspects and other features of the present invention are explained in the following description, with reference to the accompanying drawings, wherein.

DETAILED DESCRIPTION OF THE PREFERRED EMBODIMENT

Figure 1:
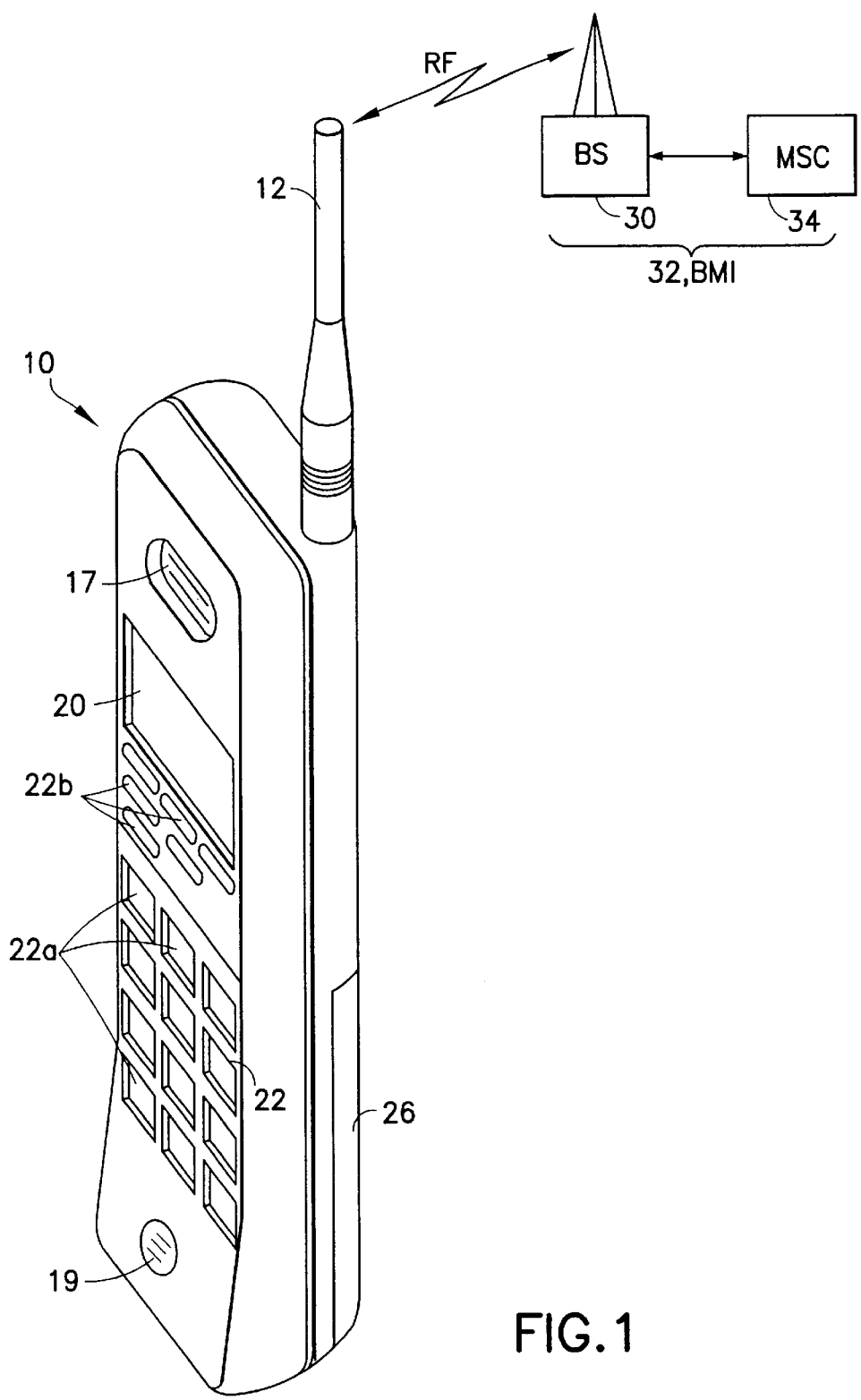
FIG. 1 is a perspective view of a mobile station and a cellular communication system to which the mobile station is bidirectionally coupled through a wireless RF link.
Figure 2:
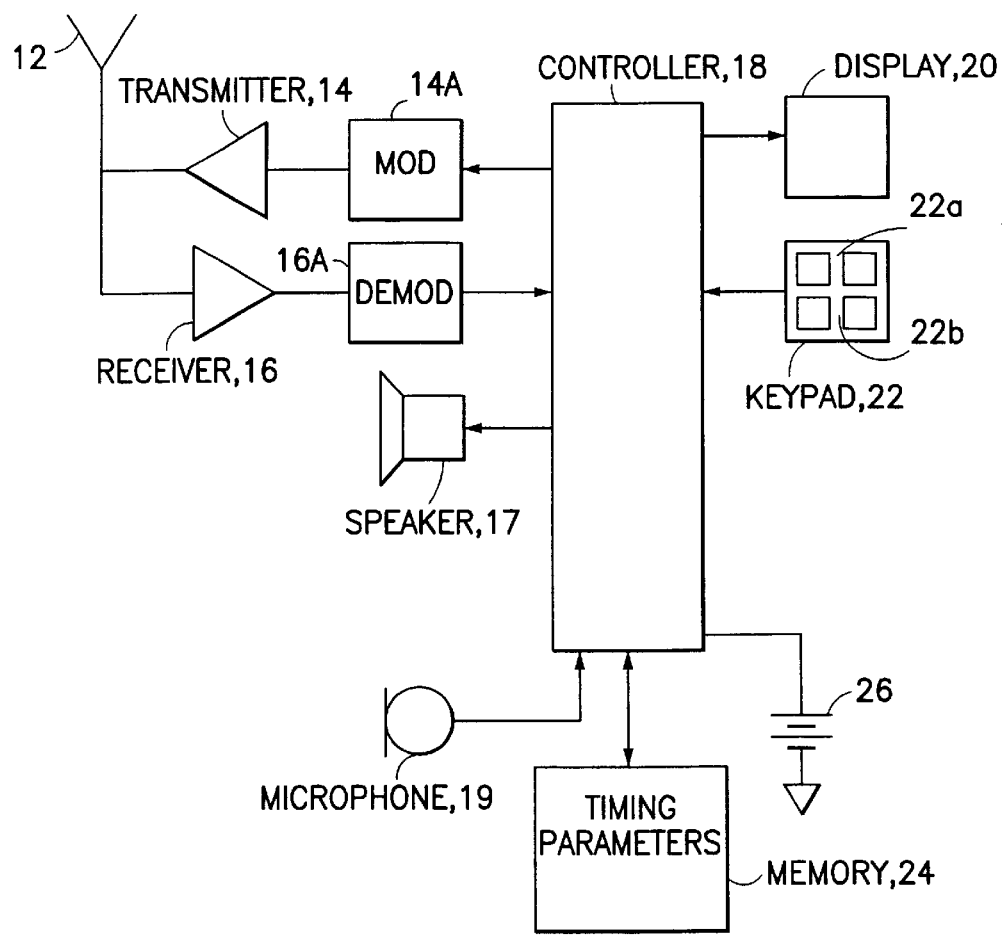
FIG. 2 is a block diagram of the mobile station shown in FIG. 1 that is constructed and operated in accordance with this invention.
Figure 3:
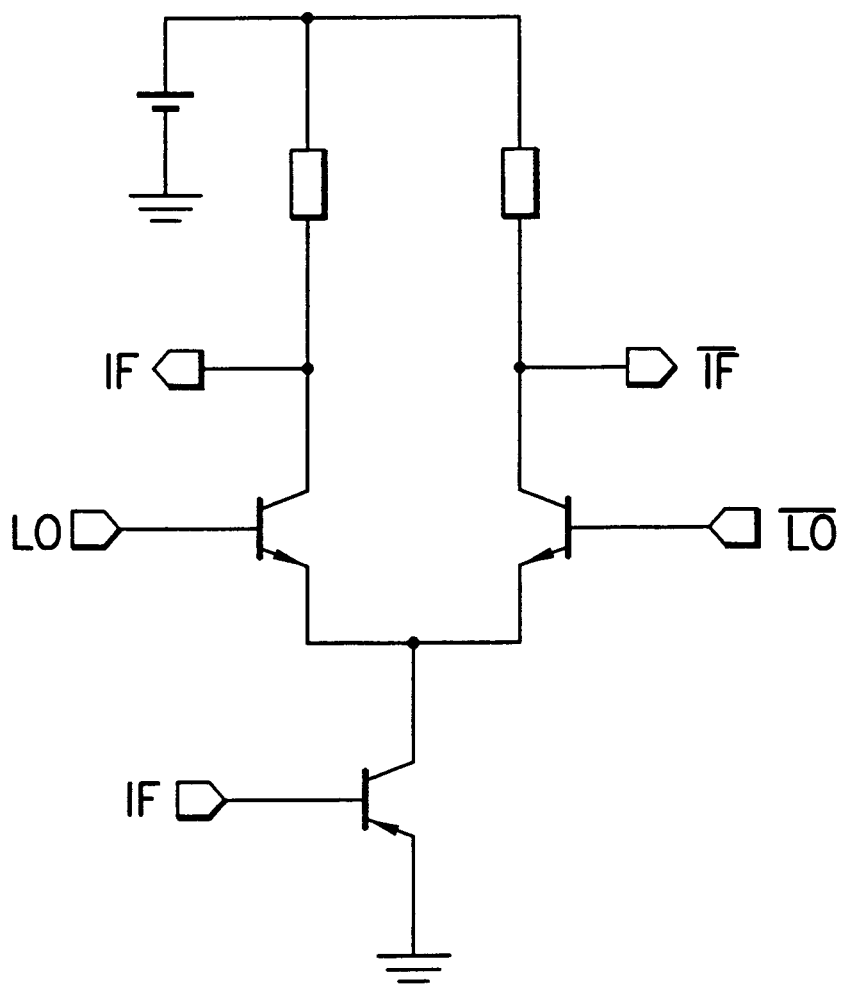
FIG. 3 is a circuit diagram of a typical singly balanced mixer.
Figure 4:
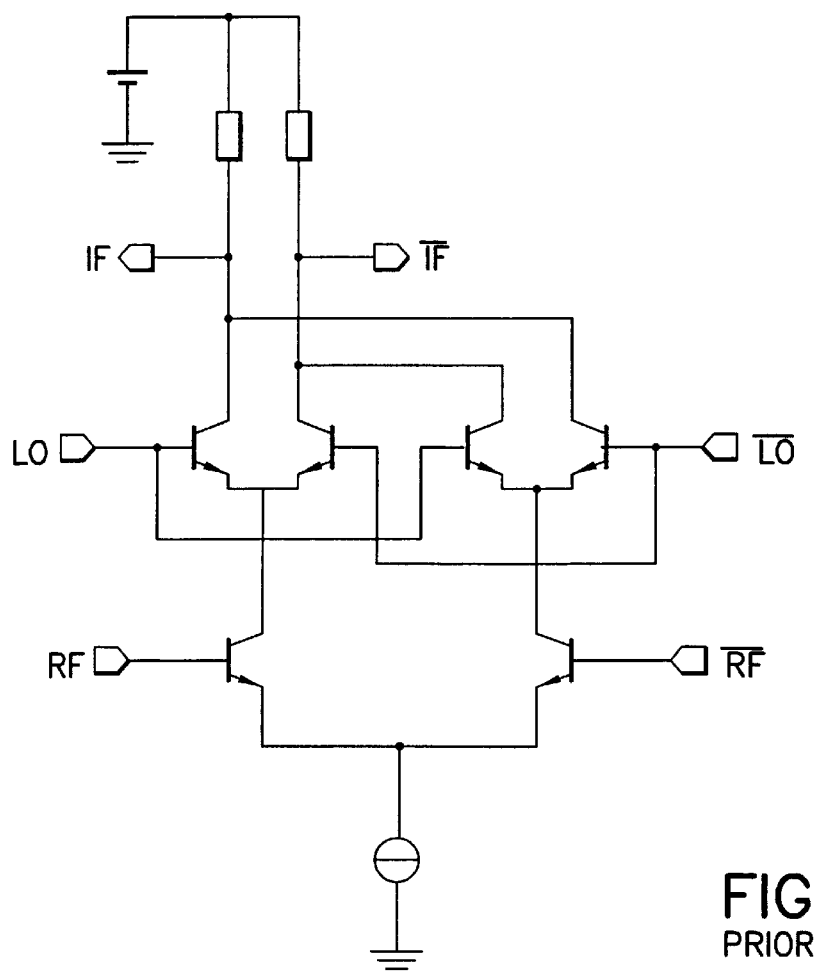
FIG. 4 is a circuit diagram of a typical double balanced mixer.

A wireless user terminal or mobile station 10 is shown in FIGS. 1 and 2, in which the subject invention may be used. The mobile station 10 includes an antenna 12 for transmitting signals to and for receiving signals 10 from a base site or base station 30. Base station 10 generally would include a base station sub-system (BSS) as well as a base transceiver station (BTS). For simplicity, these two components are collectively referred to simply as the base station 30. The base station 30 is a part of a cellular network 32 that includes a mobile switching center (MSC) 34 or similar apparatus. The MSC 34 provides a connection to landline trunks when the mobile station 10 is involved in a call.

The mobile station includes a modulator (MOD) 14A, a transmitter 14, a receiver 16, a demodulator (DEMOD) 16A, and a controller 18 that provides signals to and receives signals from the transmitter 14 and receiver 16, respectively. These signals include signaling information in accordance with the air interface standard of the applicable cellular system, and also user speech and/or user generated data. The air interface standard may be based on TDMA as used in the GSM system, although the use of this invention is not intended to be limited to a particular type of system.

The present invention could be used with any suitable type of radio telephone system or suitable electronic device. With general regard to GSM mobile stations and networks, reference can be had to "The GSM System for Mobile Communications", by Michel Mouly and Marie-Bernadette Pautet, 1992, the disclosure of which is incorporated by reference in its entirety.

Controller 18 also includes the circuitry required for implementing the audio and logic functions of the mobile station. By example, the controller 18 may be comprised of a digital signal processor device, a microprocessor device, and various analog to digital converters, digital to analog converters, and other support circuits. The control and signal processing functions of the mobile station are allocated between these devices according to their respective capabilities.

A user interface may include a conventional earphone or speaker 17, a conventional microphone 19, a display 20, and a user input device, typically a keypad 22, all of which are coupled to the controller 18. The keypad 22 includes the conventional numeric (0-9) and related keys (#,*) 22a, and other keys 22b used for operating the mobile station 10. These other keys 22b may include, by example, a SEND key, various menu scrolling and soft keys, and a PWR key. The mobile station 10 also includes a battery 26 for powering the various circuits that are required to operate the mobile station. The mobile station 10 also includes various memories, shown collectively as the memory 24, wherein are stored a plurality of constants and variables that are used by the controller 18 during the operation of the mobile station. Certain TDMA timing related parameters that are transmitted from the base station 30 to the mobile station 10 are typically stored in the memory 24 for use by the controller 18. It should be understood that the mobile station 10 can be vehicle mounted, handheld, or a stationary device. It should be further appreciated that the mobile station 10 can be capable of operating with one or more air interface standards, modulation types, and access types, and may thus be dual (or higher) mode device.

The receiver 16 also includes circuitry required for implementing the well known process of multiplexing a signal with a periodic signal to obtain a new center frequency, i.e., mixing. Mixing generally occurs immediately before multiple filter stages and receives the radio frequency (RF) signal, combines it with a periodic signal, the local oscillator (LO) signal to obtain an intermediate frequency (IF) signal which is filtered.

Figure 5:
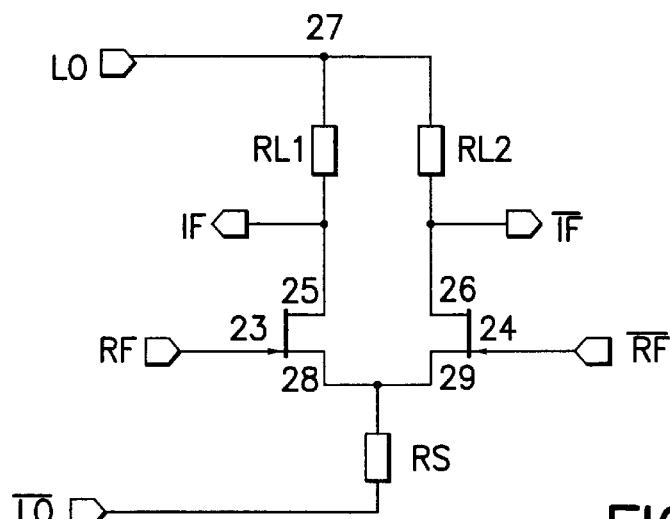
FIG. 5 is a circuit diagram of a two transistor balanced mixer illustrating one embodiment of this invention.

An embodiment of the two transistor mixer circuit 20 incorporating features of the present invention is shown in FIG. 5. As seen in FIG. 5 the circuit comprises a pair of active semiconductor devices 21 and 22. Semiconductors 21 and 22 are shown as a pair of transistors such as JFETS. However any suitable pair of matched semiconductors could be used, e.g., BJT, or MOSFETs.

The gates 23 and 24 of transistors 21 and 22 respectively are the differential signal input paths for the RF signals. The LO signal is received at node 27 and is passed to drains 25 and 26 of transistors 21 and 22 respectively, through matched load resistors $R_{L1}$ and $R_{L2}$ Source terminals 28 and 29 of transistors 21 and 22 respectively are connected to receive the LO signal through the current source resistor $R_s$. The differential output for the IF signal is taken from drains 25 and 26.

The transistors 21 and 22 of mixer 20 will operate in a reversible bias mode depending upon the half cycle of the LO signal. The supply voltage for this transistor pair 21 and 22 is a large LO AC signal. For positive half cycles of the LO signal, the transistor terminals 25 and 26 connected to their respective loads $R_{L1}$ and $R_{L2}$ are at a higher potential than the terminals 28 and 29 connected together and to the current source resistor $R_s$. The circuit operates as a differential pair having inverting power gain. In this part of the LO signal cycle, the terminals 25 and 16 connected to the loads $R_{L1}$ and $R_{L2}$ are identified as the drains, while the terminals 28 and 29 are identified as the sources. For negative LO half cycles the biasing of the circuit is reversed and the operation is different. Now the transistor terminal designations are interchanged i.e., the terminal previously identifiable as a drain is now the source. Therefore, during the negative half cycle of the LO signal, mixer circuit 20 operates as two source followers, that is, two non-inverting amplifiers having current gain. At the IF outputs 30 and 31 there is present an amplified RF signal having its phase inversion triggered by the LO signal.

Thus, the mixer circuit 20 performs the function of a double balanced mixer, in the sense that it operates as a sign-switcher and the LO-signal is balanced out from both the RF and IF ports. The RF-signal is not balanced out from the IF output unlike in a true double balanced mixer. In addition, in the two transistor mixer of this invention, there can be some difference in gain between differential pair and dual source-follower modes. The mixer function is accomplished with fewer matched parts, namely, one matched pair of transistors and one matched pair of resistors. Additionally, compared to most known double balanced mixers the present invention does not have dedicated LO switch devices which in turn makes the present invention less noisy than conventional mixers.

It should be understood that the foregoing description is only illustrative of the invention. Various alternatives and modifications can be devised by those skilled in the art without departing from the invention. For example, all or some of the resistors, shown in FIG. 5, could be replaced by inductor or resonant circuits. Accordingly, the present invention is intended to embrace all such alternatives, modifications and variances which fall within the scope of the appended claims.

What is claimed is:

1. A two transistor mixer for mixing radio frequency signals in a communications device, the mixer comprising:

a mixer core section comprising:
first and second matched semiconductor devices having a drain port, a source port, and a gate port, one pair of either of said source ports or drain ports being connected to a first node through matched load resistors, one pair of the other of either of said source ports or drain ports being connected to a second node;

a local oscillator (LO) signal input connected to said first and second nodes;

a radio frequency (RF) signal input connected to the gate ports of said first and second semiconductor device; and an intermediate frequency (IF) signal output section connected to said drain ports of said first and second semiconductor devices.

2. A two transistor mixer apparatus, as in claim 1, wherein the first and second semiconductor devices are MOS field effect transistors (MOSFET).

3. A two transistor mixer apparatus, as in claim 1, wherein said LO signal input is connected to the second node through a current source.

4. A two transistor mixer apparatus, as in claim 3, wherein said current source, connected to the second node, is a resistor.

5. A method for making a two transistor mixer adapted to radio communications, the method comprising the steps of:

interconnecting a match pair of semiconductor devices to form a mixer circuit, said semiconductor devices having gate ports, source ports and drain ports;

applying a local oscillator(LO) signal to said drain ports and to said source ports of said semiconductor devices, such that in the positive half cycle, said mixer circuit operates as a differential pair having inverting power gain and during the negative half cycle of said LO signal, said mixer circuit operates as two non-inverting amplifiers having current gain;

applying a radio frequency (RF) signal to said gate ports of said semiconductor devices; and obtaining an intermediate frequency (IF) signal from the drain ports of said semiconductor devices, wherein said IF signal is an amplified RF signal having its phase inversion triggered by the LO signal.

* * * * *